US008467168B2

(12) United States Patent
Honer et al.

(10) Patent No.: US 8,467,168 B2
(45) Date of Patent: Jun. 18, 2013

(54) ELECTRONIC SYSTEM CHANGEABLE TO ACCOMMODATE AN EHD AIR MOVER OR MECHANICAL AIR MOVER

(75) Inventors: Kenneth Honer, Santa Clara, CA (US); Yan Zhang, San Jose, CA (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 13/289,852

(22) Filed: Nov. 4, 2011

(65) Prior Publication Data

US 2012/0120542 A1    May 17, 2012

Related U.S. Application Data

(60) Provisional application No. 61/412,721, filed on Nov. 11, 2010, provisional application No. 61/530,843, filed on Sep. 2, 2011.

(51) Int. Cl.
*H01H 47/00* (2006.01)
(52) U.S. Cl.
USPC ............................................ 361/231; 361/220
(58) Field of Classification Search
USPC .................................. 361/212, 220, 230, 231
See application file for complete search history.

(56) References Cited

U.S. PATENT DOCUMENTS

| | | |
|---|---|---|
| 6,504,308 B1 | 1/2003 | Krichtafovitch et al. |
| 6,919,698 B2 | 7/2005 | Krichtafovitch |
| 7,157,704 B2 | 1/2007 | Krichtafovitch et al. |
| 7,334,630 B2 | 2/2008 | Goodson et al. |
| 7,545,640 B2 | 6/2009 | Fisher et al. |
| 7,661,468 B2 | 2/2010 | Schlitz |
| 7,802,970 B2 | 9/2010 | Singhal et al. |
| 8,305,728 B2 * | 11/2012 | Lee et al. ....................... 361/231 |
| 2005/0047056 A1* | 3/2005 | Huang ........................... 361/212 |
| 2006/0169441 A1 | 8/2006 | Schlitz |
| 2006/0249279 A1 | 11/2006 | Chordia et al. |
| 2008/0118370 A1 | 5/2008 | Zoulkameev et al. |
| 2009/0001787 A1* | 1/2009 | Lawall et al. .............. 297/217.1 |
| 2010/0052540 A1 | 3/2010 | Jewell-Larsen |
| 2010/0110602 A1 | 5/2010 | Schlitz |
| 2010/0177519 A1 | 7/2010 | Schlitz |
| 2011/0292560 A1 | 12/2011 | Jewell-Larsen et al. |

FOREIGN PATENT DOCUMENTS

| | | |
|---|---|---|
| JP | 2009121288 A | 6/2009 |
| WO | 2007112763 A1 | 10/2007 |

OTHER PUBLICATIONS

Jewell-Larsen. "Modeling of corona-induced electrohydrodynamic flow with COMSOL multiphysics." Proc. ESA Annual Meeting on Electrostatics 2008, Paper E1. pp. 1-13.

(Continued)

*Primary Examiner* — Danny Nguyen
(74) *Attorney, Agent, or Firm* — Zagorin O'Brien Graham LLP

(57) ABSTRACT

An electronic system is configurable to accommodate either of a mechanical air mover and an EHD air mover within an enclosure. At least one of a plurality of electronic components is selectively configurable to alternately accommodate the mechanical air mover or the EHD air mover within the enclosure. The mechanical fan or EHD is positioned to motivate air flow along a air flow path between inlet and outlet ventilation boundaries of the enclosure. A connector for a respective one of the electronic components allows for selective configuration in an alternate orientation of the respective one of the electronic components to accommodate a difference in geometry between the EHD air mover and the mechanical air mover.

20 Claims, 5 Drawing Sheets

OTHER PUBLICATIONS

Yang. "Corona-driven air propulsion for cooling of microelectronics." Master Thesis. Department of Electrical Engineering, University of Washington, Seattle, WA, 2002. pp. 1-4.

Kazemi et al. "Electrohydrodynamic Micropumps with Asymmetric Electrode Geometries for Microscale Electronics Cooling." IEEE Transactions on Dielectrics and Electrical Insulation. Apr. 2009. vol. 16. No. 2. pp. 483-488.

"Ventiva Solid State Fans." www.ventiva.com, 2010. Accessed Dec. 10, 2010.<http://www.ventiva.com/Ventiva_Brochure_10-1-10.pdf>.

* cited by examiner

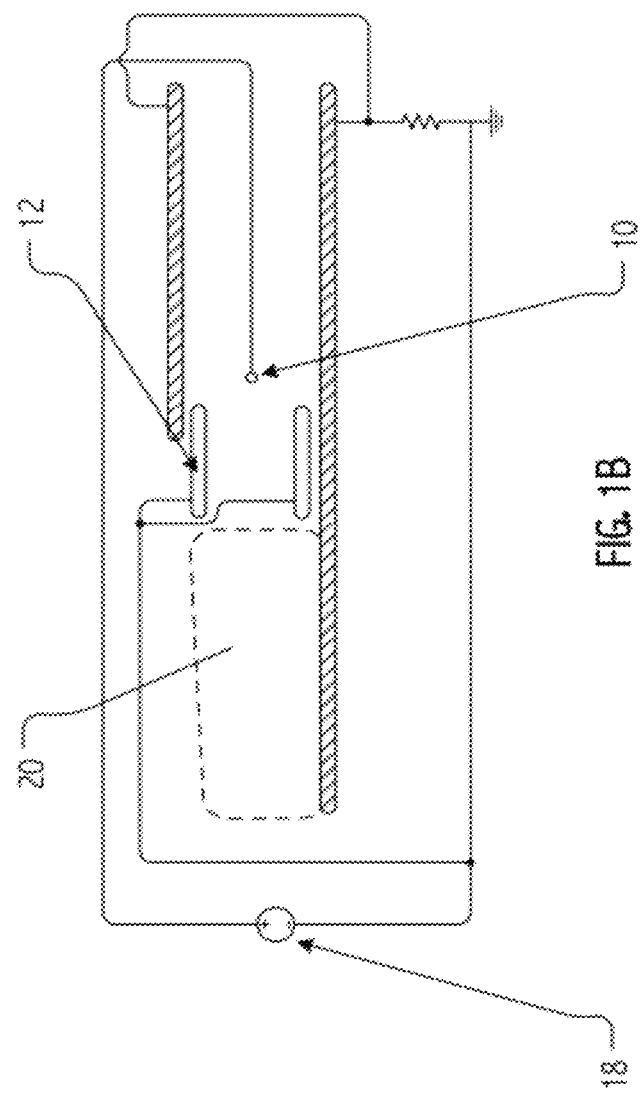

US 8,467,168 B2

ELECTRONIC SYSTEM CHANGEABLE TO ACCOMMODATE AN EHD AIR MOVER OR MECHANICAL AIR MOVER

CROSS-REFERENCE TO RELATED APPLICATIONS

The present application claims the benefit of U.S. Provisional Application No. 61/412,721, filed Nov. 11, 2010, and U.S. Provisional Application No. 61/530,843, filed Sep. 2, 2011, both of which are incorporated herein in their entirety by reference.

BACKGROUND

The present application relates to thermal management and, more particularly, to micro-scale cooling devices that generate ions and electrical fields to motivate flow of fluids, such as air, as part of a thermal management solution to dissipate heat.

Many devices or systems, whether electronic, optical, mechanical, may include, provide or require forced flow of air or some other fluid. In some cases, the forced flow is useful to cool or otherwise moderate heat evolved by thermal sources within the device or system. In such cases, cooling or thermal moderation may help prevent device overheating, reduce thermal hotspots, provide desired thermal stability for temperature sensitive devices, improve long term reliability or provide other benefits. In some cases, forced flow may be a primary function of the device or system.

It is known in the art to provide cooling air flow using fans, blowers or other similar moving mechanical devices; however, such devices generally have limited operating lifetimes, tend to produce undesired noise or vibration, consume power or suffer from other design problems. In addition, such devices can often impose constraints of geometry, form factor and/or layout in systems for which they provide cooling air flows. These constraints can be particularly problematic in modern consumer electronics devices for which size has become an important market differentiator.

In general, electrohydrodynamic (EHD) technology uses ion flow principles to move fluids (e.g., air molecules). Devices built using the principle of ionic movement of a fluid are variously referred to in the literature as ionic wind machines, electric wind machines, corona wind pumps, electro-fluid-dynamics (EFD) devices, electrostatic fluid accelerators (EFAs), electrohydrodynamic (EHD) thrusters and EHD gas pumps. Some aspects of the technology have also been exploited in devices referred to as electrostatic air cleaners or electrostatic precipitators.

In some applications, the use of an ion flow air mover device, such as an EHD device or EFD device, may result in improved cooling efficiency and reduced vibrations, power consumption, electronic device temperatures, and noise generation. In such deployments, an EHD device may reduce costs, allow for reduced device size, thickness or volume, and may in some cases improve electronic device performance and/or user experience.

Accordingly, improvements are sought in implementing EHD air mover cooling in traditionally mechanical fan-cooled applications.

SUMMARY

The present invention relates generally to integration of EHD-type air movers with electronic systems, and in particular, to techniques for accommodating either a mechanical air mover or EHD air mover in combination with electronic components in a limited volume installation.

It has been discovered that flow paths, duct work, ventilation boundaries and/or placement of EHD and mechanical air movers within an electronic device enclosure can all affect the efficacy of a thermal management solution. In particular, for electronic devices in which it is desirable to employ forced convective cooling over a portion of a thermal operating envelope, practical designs for consumer electronics form factors may be quite sensitive to flow path, duct work and ventilation boundary design as well as to the placement of EHD and mechanical air mover components. The illustrated embodiments, depictions and claims that follow are descriptive of a range of inventive solutions that have been developed to address some or all of these design challenges.

It has been discovered that an electronic system may be configured to accommodate either of a mechanical air mover (e.g., fan or blower) or an electrohydrodynamic (EHD) air mover via repositioning of an electronic system component, e.g., SSD, hard drive, communications card, I/O board, battery or other substantially non-symmetrical component. In some implementations, an entire motherboard or daughterboard can be shifted or repositioned to accommodate one of the EHD air mover and the mechanical air mover within a limited internal volume. In some implementations, a substitute component may serve to accommodate the difference in size between the air movers, e.g., changing the number of cells in a battery.

In some implementations in accordance with the present invention, an electronic system includes an enclosure having inlet and outlet ventilation boundaries and a flow path defined within the enclosure between the inlet and outlet ventilation boundaries. One or more thermal sources within the enclosure generates heat during operation of the electronic system. The thermal sources are thermally coupled to heat transfer surfaces introduced into the flow path to dissipate heat through forced convection cooling and through passive cooling.

In some implementations, a system may be configured to accommodate two mechanical air movers or a single mechanical air mover in combination with an EHD air mover. Thus, description of substitution of one or more EHD air movers for a mechanical air mover does not preclude implementation of a combination of both EHD and mechanical air movers within a given device or system.

One aspect of the invention features, in some implementations, an electronic system including an enclosure housing a plurality of electronic components, an air flow path through the enclosure; and an EHD air mover positioned to motivate air flow along the air flow path between inlet and outlet ventilation boundaries of the enclosure. The air flow path and at least one of the plurality of electronic components is configurable to alternately accommodate a mechanical air mover in place of the EHD air mover within the enclosure.

In some implementations, a connector for a respective at least one of the plurality of electronic components allows for alternate orientation of the respective one of the electronic components to accommodate a difference in geometry between the EHD air mover and the mechanical air mover.

In some implementations, the electronic system further includes first and second mounting points for the respective electronic component in first and second orientations.

In some implementations, the electronic system further includes replicated electrical connection points to accommodate the respective electronic component in first and second orientations.

In some implementations, the at least one electronic component is repositionable in first and second orientations, the first orientation providing a substantially symmetrical space to accommodate a mechanical fan and the second providing an elongated space to accommodate the EHD air mover.

In some implementations, the electronic system further includes alternate mounting points for the respective at least one of the plurality of electronic components in the alternate orientation.

In some implementations, the electronic system further includes a transition duct between the EHD air mover and a portion of the air flow path. In some implementations, the ductwork is adaptable or changeable to accommodate the EHD air mover or mechanical air mover. For example, a wider outlet vent, or at least a wide portion of such a vent, may be used with the elongated EHD air mover, while a shorter outlet vent or at least a shortened portion of the outlet vent may be used with the mechanical air mover. For example, a simple barrier may be inserted over a portion of the outlet vent to size the outlet vent to the cross-section of the mechanical air mover. Similarly, an outlet vent portion may be opened for use with one of the EHD air mover and mechanical air mover and closed during use of the other air mover.

In some implementations, the air flow path is configured to accommodate the mechanical air mover via an alternate mechanical air mover transition duct.

Another aspect of the invention features, in some implementations, an electronic system including an enclosure housing a plurality of electronic components, an air flow path through the enclosure, and a mechanical air mover positioned to motivate air flow along the air flow path between inlet and outlet ventilation boundaries of the enclosure. The air flow path and at least one of the plurality of electronic components is configurable to alternately accommodate an EHD air mover in place of the mechanical air mover within the enclosure.

In some implementations, a data or power connector for the at least one electronic component is one of moveable, extendable, pivotable, and flexible to accommodate repositioning of the at least one electronic component.

In some implementations, ozone reducing material is provided on surfaces downstream of the EHD air mover. In some implementations, at least a portion of either or both of the circuit board or other electronic components and an interior surface of the enclosure or ductwork are coated with a protective coating robust to ozone. In some cases, the protective coating robust to ozone includes a fluoropolymer of tetrafluoroethylene such as a Teflon® material. In some cases, at least a portion of either or both of the circuit board and an interior surface of the enclosure are coated with an ozone catalytic or reactive material.

In some implementations, the electronic system includes a thermal transfer pathway from one or more thermal sources disposed on a circuit board to heat transfer surfaces in a flow path along which fluid flow is motivated by the mechanical or EHD air mover.

In some embodiments, the heat transfer pathway includes either or both of a heat pipe and a heat spreader. In some embodiments, at least a portion of the heat transfer pathway is coated with an ozone catalytic or reactive material.

In some implementations, multiple EHD air movers may be provided. For example, a first EHD air mover can force air into the enclosure at the inlet of a consumer electronics device, while a second EHD air mover exhausts air from the outlet of the device.

In some implementations, the enclosure is substantially sealed such that fluid flow motivated by the EHD fluid mover is substantially contained within the enclosure. In some implementations, the enclosure allows at least some fluid flow to transit a boundary between an interior volume therewithin and the exterior. In some implementations, flux of fluid through the EHD air mover substantially exceeds, at least by a factor of two, that transiting the boundary. In some cases, the enclosure includes one or more ventilation portions of the boundary through which a substantial entirety of the fluid flux motivated by the EHD air mover is admitted and exhausted. Of course, those of skill in the art will appreciate that EHD principles may be applied to motivate any number of fluids. Thus, references to EHD air movers contemplate deployment with fluids other than air.

Another aspect of the invention features, in some implementations, an electronic system including a substantially sealed enclosure housing a plurality of electronic components and an air flow path within the enclosure. An EHD air mover is positioned to motivate air flow along the air flow path and at least one of the plurality of electronic components is positionally configurable to alternately accommodate a mechanical air mover in place of the EHD air mover within the enclosure.

In some implementations, a connector for a respective one of the electronic components allows for selective configuration in an alternate orientation of the respective one of the electronic components to accommodate a difference in geometry between the EHD air mover and the mechanical air mover.

In some implementations, the enclosure allows at least some air flow to transit a boundary between an interior enclosure volume and the exterior.

Another aspect of the invention features a method of configuring an electronic system for forced convective cooling of a plurality of electronic components housed in an enclosure. The method includes positioning at least one of the plurality of electronic components in one of two predetermined configurations to accommodate either of a mechanical air mover and an EHD air mover for convective cooling. The method further includes coupling the at least one of the plurality of electronic components to another of the plurality of electronic components in the electronic system in the selective position of the at least one of the plurality of electronic components; and installing the one of the mechanical fan and the EHD air mover to motivate air flow along an air flow path between inlet and outlet ventilation boundaries of the enclosure.

In some applications, the method includes configuring a connector for coupling the respective one of the electronic components to accommodate a difference in geometry between the EHD air mover and the mechanical air mover.

In some applications, configuring the connector includes one of pivoting, rotating, and extending the connector based on the selective positioning for the respective electronic component.

In some applications, the respective electronic component is positioned to provide a generally symmetrical volume to accommodate the mechanical air mover.

In some applications, the respective electronic component is positioned to provide a generally elongated volume to accommodate the EHD air mover.

In some applications, the method includes installing a transition duct proximate the positioned one of the mechanical air mover and EHD air mover to define at least a portion of the air flow path.

In some applications, transition ducting can be used to accommodate differences in dimensions between an EHD air mover and a mechanical air mover, e.g., in a particular example, an EHD outlet cross-section can be up to 50 percent larger than a mechanical air mover outlet cross-section.

In some applications, coupling the at least one of the plurality of electronic components includes selecting a respective one of replicated connection points corresponding to the selected orientation of the respective electronic component.

These and other embodiments will be understood with reference to the description herein, the drawings and the appended claims.

BRIEF DESCRIPTION OF THE DRAWINGS

The present invention may be better understood, and its numerous objects, features, and advantages made apparent to those skilled in the art by referencing the accompanying drawings.

FIG. 1b is a depiction of an illustrative high voltage power supply configuration in which emitter and collector electrodes are energized to motivate fluid flow.

The use of the same reference symbols in different drawings indicates similar or identical items.

DESCRIPTION OF THE PREFERRED EMBODIMENT(S)

Electrohydrodynamic (EHD) Fluid Acceleration, Generally

Figure 1A:
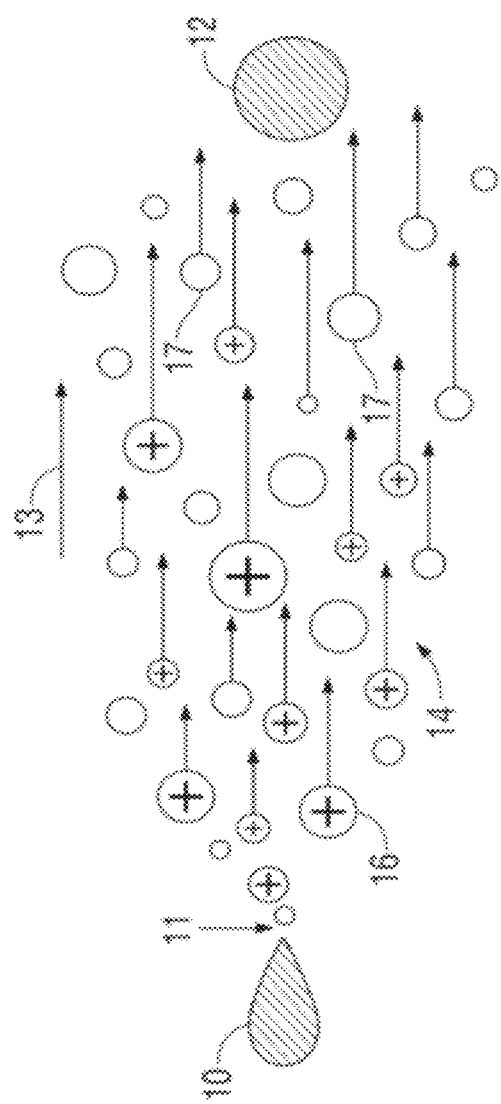
FIG. 1a is a depiction of certain basic principles of electrohydrodynamic (EHD) fluid flow.

Basic principles of electrohydrodynamic (EHD) fluid flow are well understood in the art and, in this regard, an article by Jewell-Larsen, N. et al., entitled "Modeling of corona-induced electrohydrodynamic flow with COMSOL multiphysics" (in the *Proceedings of the ESA Annual Meeting on Electrostatics* 2008) (hereafter, "the Jewell-Larsen Modeling article"), provides a useful summary. Likewise, U.S. Pat. No. 6,504,308, filed Oct. 14, 1999, naming Krichtafovitch et al. and entitled "Electrostatic Fluid Accelerator" describes certain electrode and high voltage power supply configurations useful in some EHD devices. U.S. Pat. No. 6,504,308, together with sections I (Introduction), II (Background), and III (Numerical Modeling) of the Jewell-Larsen Modeling article are hereby incorporated by reference herein for all that they teach.

EHD fluid mover designs described herein can include one or more corona discharge-type emitter electrodes. In general, such corona discharge electrodes include a portion (or portions) that exhibit(s) a small radius of curvature and may take the form of a wire, rod, edge or point(s). Other shapes for the corona discharge electrode are also possible; for example, the corona discharge electrode may take the shape of barbed wire, wide metallic strips, and serrated plates or non-serrated plates having sharp or thin parts that facilitate ion production at the portion of the electrode with the small radius of curvature when high voltage is applied. In general, corona discharge electrodes may be fabricated in a wide range of materials. For example, in some embodiments, compositions such as described in U.S. Pat. No. 7,157,704, filed Dec. 2, 2003, entitled "Corona Discharge Electrode and Method of Operating the Same" and naming Krichtafovitch et al. as inventors may be employed. U.S. Pat. No. 7,157,704 is incorporated herein for the limited purpose of describing materials for some emitter electrodes that may be employed in some corona discharge-type embodiments. In general, a high voltage power supply creates the electric field between corona discharge electrodes and collector electrodes.

EHD fluid mover designs described herein include ion collection surfaces positioned downstream of one or more corona discharge electrodes. Often, ion collection surfaces of an EHD fluid mover portion include leading surfaces of generally planar collector electrodes extending downstream of the corona discharge electrode(s). In some cases, collector electrodes may do double-duty as heat transfer surfaces. In some cases, a fluid permeable ion collection surface may be provided.

In general, collector electrode surfaces may be fabricated of any suitable conductive material, such as aluminum or copper. Alternatively, as disclosed in U.S. Pat. No. 6,919,698 to Krichtafovitch, collector electrodes (referred to therein as "accelerating" electrodes) may be formed of a body of high resistivity material that readily conducts a corona current, but for which a result voltage drop along current paths through the body of high resistivity collector electrode material provides a reduction of surface potential, thereby damping or limiting an incipient sparking event. Examples of such relatively high resistance materials include carbon filled plastic, silicon, gallium arsenide, indium phosphide, boron nitride, silicon carbide, and cadmium selenide. U.S. Pat. No. 6,919,698 is incorporated herein for the limited purpose of describing materials for some collector electrodes that may be employed in some embodiments. Note that in some embodiments described herein, a surface conditioning or coating of high resistivity material (as contrasted with bulk high resistivity) may be employed.

Basic principles of EHD fluid flow are reasonably well understood by persons of skill in the art. Accordingly, a brief illustration of ion flow using corona discharge principles in a simple two electrode system sets the stage for the more detailed description that follows.

With reference to the illustration in FIG. 1, EHD principles include applying a high intensity electric field between a first electrode 10 (often termed the "corona electrode," the "corona discharge electrode," the "emitter electrode" or just the "emitter") and a second electrode 12. Fluid molecules, such as surrounding air molecules, near the emitter discharge region 11, become ionized and form a stream 14 of ions 16 that accelerate toward second electrode 12, colliding with neutral fluid molecules 17. During these collisions, momentum is imparted from the stream 14 of ions 16 to the neutral fluid molecules 17, inducing a corresponding movement of fluid molecules 17 in a desired fluid flow direction, denoted by arrow 13, toward second electrode 12. Second electrode 12 may be variously referred to as the "accelerating," "attracting," "target" or "collector" electrode. While stream 14 of ions 16 is attracted to, and generally neutralized by, second electrode 12, neutral fluid molecules 17 continue past second electrode 12 at a certain velocity. The movement of fluid produced by EHD principles has been variously referred to as "electric," "corona" or "ionic" wind and has been defined as the movement of gas induced by the movement of ions from the vicinity of a high voltage discharge electrode 10.

With reference to FIG. 1b, an EHD air mover is illustrated in which emitter 10 and collector electrodes 12 are energized by a high voltage power supply 18 to motivate fluid flow over heat transfer surfaces 20, e.g., heat fins, a heat pipe, or a heat spreader. Typically the motivated fluid is air, although in some embodiments, particular sealed enclosure embodiments, other fluids with constituents not necessarily typical of air, may be used.

In the present application, some aspects of embodiments illustrated and described herein are referred to as electrohydrodynamic fluid accelerator devices, also referred to as "EHD devices," "EHD fluid accelerators," "EHD fluid movers," and the like. For concreteness, some embodiments are described relative to particular EHD device configurations in which a corona discharge at or proximate to an emitter electrode operates to generate ions that are accelerated in the presence of electrical fields, thereby motivating fluid flow. While corona discharge-type devices provide a useful descriptive context, it will be understood (based on the present description) that other ion generation techniques may also be employed. For example, in some embodiments, techniques such as silent discharge, AC discharge, dielectric barrier discharge (DBD), or the like, may be used to generate ions that are in turn accelerated in the presence of electrical fields and motivate fluid flow.

In general, a variety of scales, geometries and other design variations are envisioned for electrostatically operative surfaces that functionally constitute a collector electrode, together with a variety of positional interrelationships between such electrostatically operative surfaces and the emitter and/or collector electrodes of a given EHD device. For example, in some implementations, opposing planar collector electrodes are arranged as parallel surfaces proximate to a corona discharge-type emitter wire that is displaced from leading portions of the respective collector electrodes. Nonetheless, other embodiments may employ other electrostatically operative surface configurations or other ion generation techniques and will nonetheless be understood in the descriptive context provided herein.

Using heat transfer surfaces that, in some embodiments, take the form of heat transfer fins, heat dissipated by electronics (e.g., microprocessors, graphics units, etc.) and/or other components can be transferred to the motivated air flow and exhausted from an enclosure through a ventilation boundary. Typically, when a thermal management system is integrated into an operational environment, heat transfer paths (often implemented as heat pipes or using other technologies) are provided to transfer heat from where it is dissipated (or generated) to a location (or locations) within the enclosure where air flow motivated by an EHD air mover (or mechanical air mover) flows over heat transfer surfaces.

Figure 2:
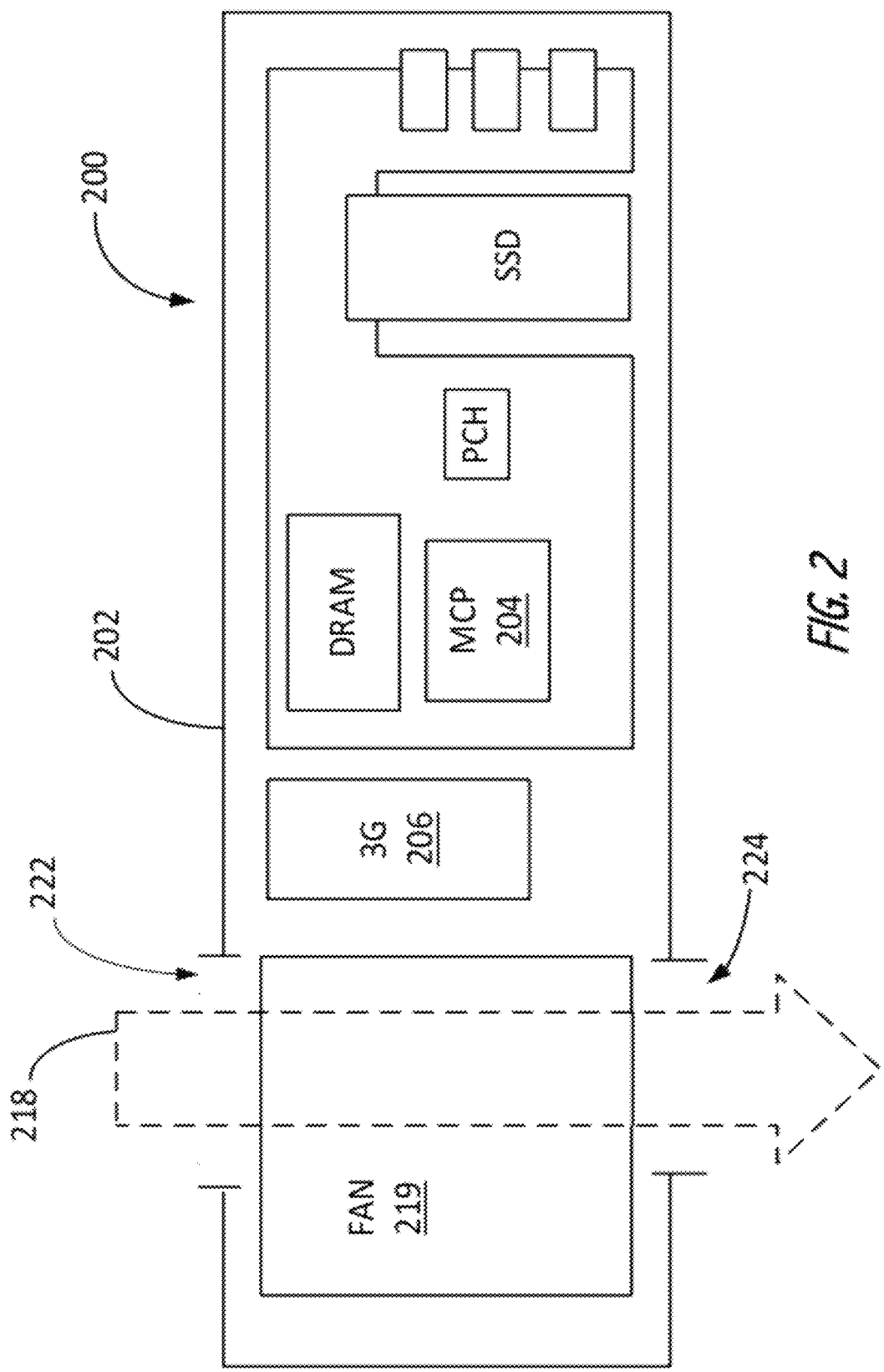
FIG. 2 depicts a top view of an electronic system configuration incorporating a mechanical fan.

With reference to FIG. 2, an electronic system 200 includes an enclosure 202 housing various electronic components, e.g., a microprocessor 204, video unit, battery and/or display illumination source, generating heat during operation of the electronic system. A heat pipe or other heat path conveys heat from the one or more electronic components to one or more heat transfer surfaces positioned within an air flow 218 motivated by a mechanical fan 219. Note that for simplicity and clarity of illustration heat transfer surfaces, heat pipes, heat spreaders and the like are not specifically illustrated, however, one of ordinary skill in art would readily appreciate how to arrange these devices for a particular board or fan configuration.

The enclosure 202 has inlet and outlet ventilation boundaries 222 and 224 and the mechanical fan 219 motivates air flow 218 along a flow path between the inlet and outlet ventilation boundaries 222 and 224. Mechanical fan 219 can be an axial fan or a radial blower or other air moving device suitable to motivate air. At least one of the electronic components, e.g., a 3G card 206 is installed in a first position adjacent mechanical fan 219.

Figure 3:
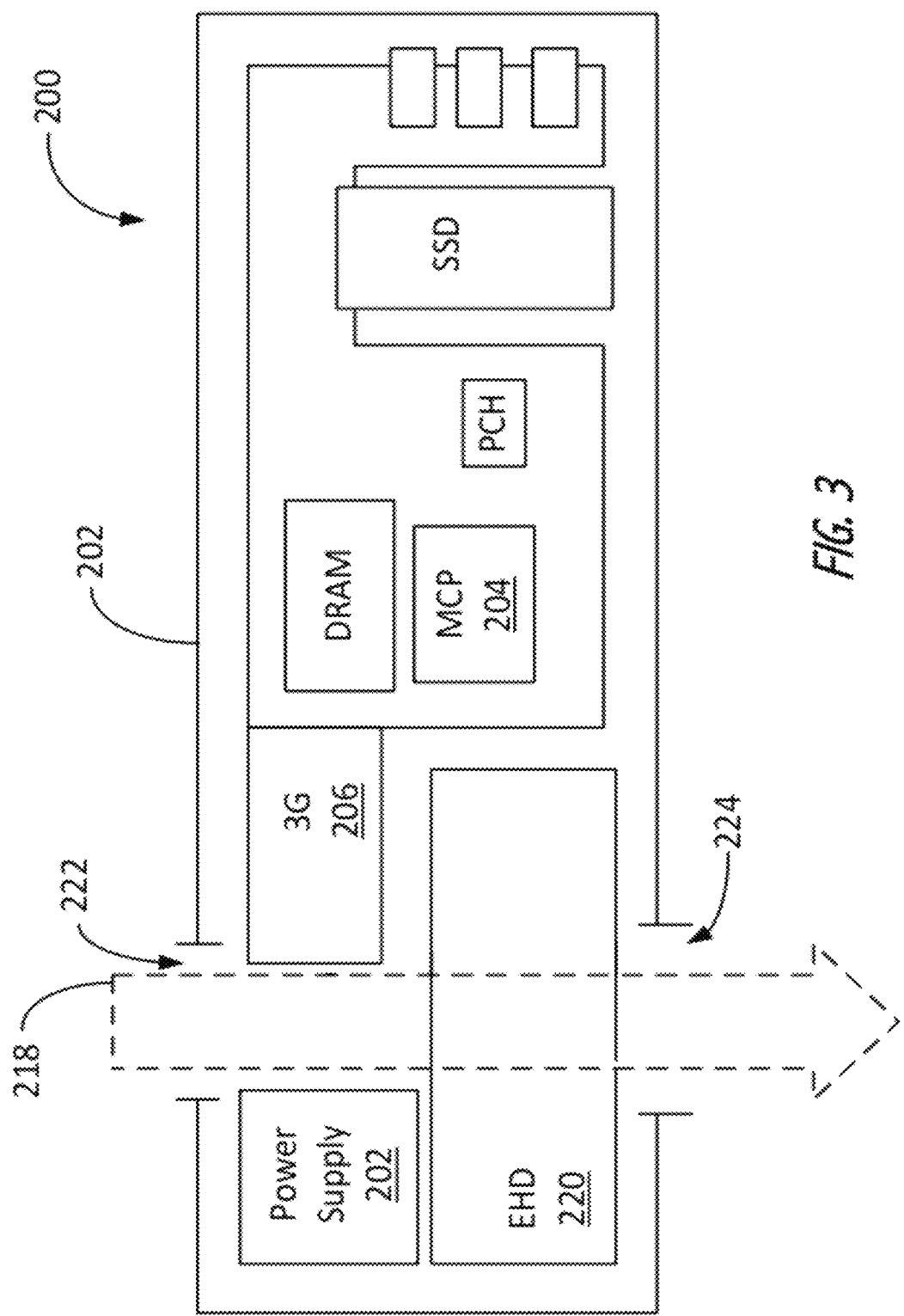
FIG. 3 depicts a top view of an electronic system configuration incorporating an EHD air mover.

With reference to FIG. 3, electronic system 200 includes an EHD air mover 220 in place of mechanical fan 219. 3G card 206 is installed in a second position to accommodate EHD air mover 220. Thus, the EHD air mover 220 and at least one component of the electronic system 200, e.g., repositioned 3G card 206, fit within substantially the same space occupied in the previous installation by mechanical fan 219 and 3G card 206. Heat transfer devices such as heat pipes, heat spreaders, and particular heat transfer surface configuration are not shown for the sake of simplicity, however, one of ordinary skill in the art would appreciate how to arrange such device for a particular layout or application.

Such flexibility for repositioning of electronic components can be provided, e.g., via flexible connectors and/or via dual connection points, e.g., for power supply, data, signaling, and take off and/or fan contacts. For example, dual connection points may provide power and/or data couplers in either of the positions of the repositionable component. Alternatively, the connection point itself may be versatile or flexible to accommodate either orientation of the repositionable component or either of the mechanical fan 219 and EHD air mover 220. For example, the connection point may include movable, pivotable, extendible, or flexible power and/or data couplings. In some cases, an adapter or lengthened data and/or power couplings can serve to accommodate repositioning of the component.

In some embodiments, inlet and outlet ventilation boundaries 222 and 224, air flow 218 and enclosure 202 are configured and arranged to accommodate either of mechanical fan 219 and EHD air mover 220 with minimal or no alteration. In some cases, for example, mounting points for both the mechanical fan 219 and EHD air mover 220 can be provided on enclosure 202. Alternatively, an adapter base with common mounting points or different adapter bases may be used to mount the selected one of the mechanical or EHD air movers within the enclosure. In some cases, suitable transition ducting to adjust for dimensional differences of the mechanical fan flow path and the EHD device flow path can be integrated with either device or may be installed separately.

In some implementations, the repositionable electronic component is one of an SSD, hard drive, and communications card that may be repositioned to selectively accommodate the mechanical fan 219 or EHD air mover 220.

Any of a variety of air flow configurations may be provided. For example, air flow 218 may flow over a broad area of enclosure 202 or, alternatively, across a more limited channel therein. Similarly, inlet and outlet ventilation boundaries 222 and 224 may be arranged in any suitable combination, for example, along any combination of surfaces, edges, or sides of enclosure 202. In some implementations, (not shown), plural EHD air movers 220 may be provided to both push and pull airflow 218 between inlet and outlet ventilation boundaries 222 and 224.

Note that, in some unventilated embodiments, EHD motivated fluid flow may be circulated within an enclosure, which in turn, may radiatively or convectively transfer heat to the ambient environment. In this way, hotspots on the exterior surface of the enclosure can be eliminated or at least mitigated even without significant airflow through a ventilation boundary. Of course, in some embodiments, EHD motivated flow(s) may be employed both to manage localized hotspots and to exhaust heat by forced convective heat transfer to an air flow that transits a ventilation boundary.

Figure 4:
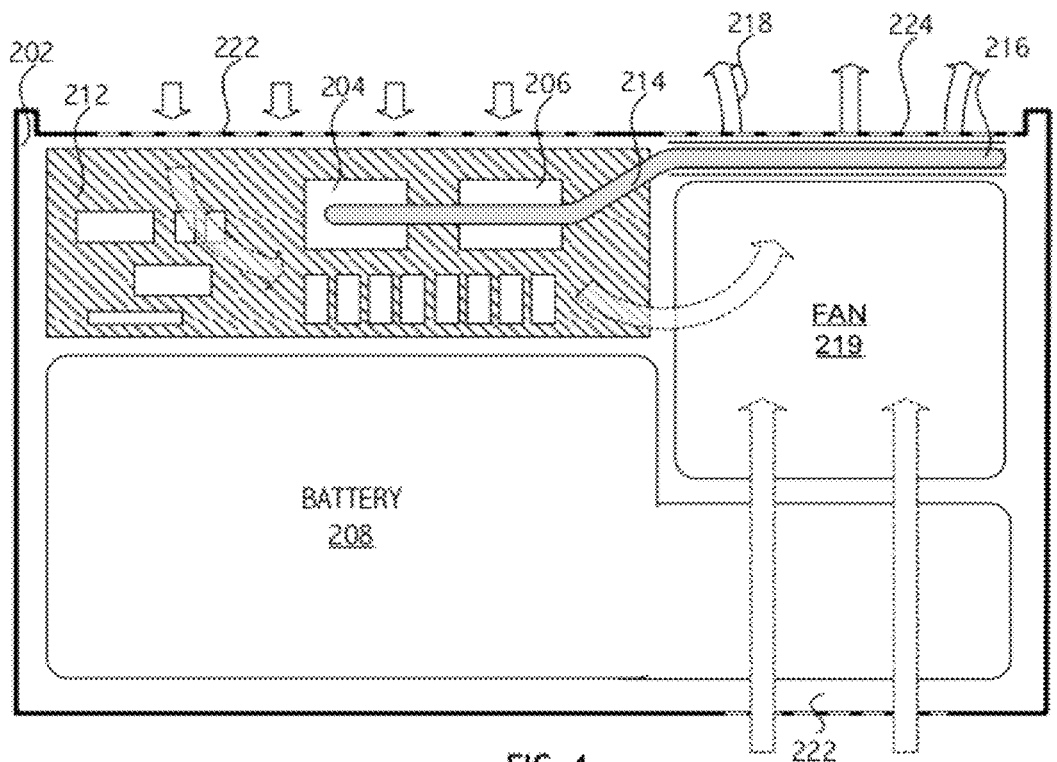
FIG. 4 depicts a top view of another electronic system configuration incorporating a mechanical air mover.

With reference to FIG. 4, an electronic system includes an enclosure 202 housing various electronic system components, e.g., a microprocessor 204, graphics unit 206, and battery 208, any or all of which may generate heat during operation of the electronic system. Enclosure 202 further defines an internal plenum 212 housing one or more of the electronic system components 204, 206. A heat pipe 214 or other heat transfer path conveys heat from one or more heat sources within the internal plenum 212 to a heat transfer surface(s) 216 positioned within an air flow 218 motivated by a mechanical air mover 219. Note that heat pipe 214 is illustrated schematically and is not meant to suggest any particular topology of heat transfer pathways from particular thermal sources to heat transfer surface(s) 216. Rather, based on the description herein, persons of ordinary skill in the art will recognize topological variations suitable for heat transfer needs of particular systems. The enclosure 202 has inlet and outlet ventilation boundaries 222 and 224 and the mechanical air mover 219 motivates air flow along a flow path between the inlet and outlet ventilation boundaries 222 and 224.

Figure 5:
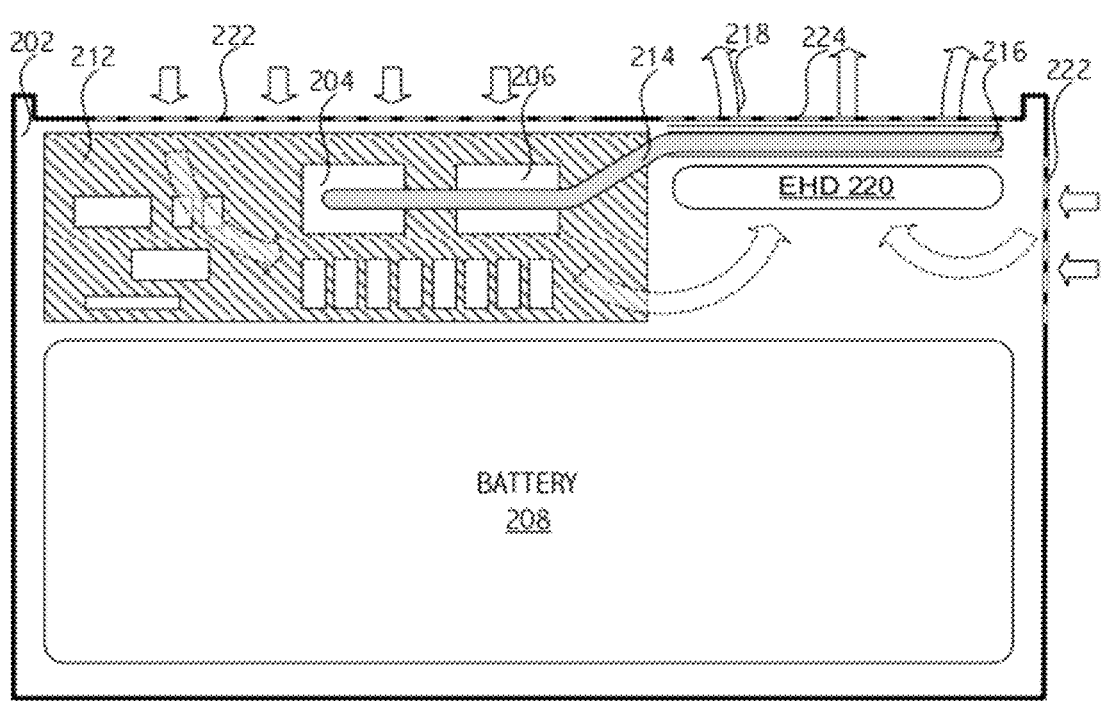
FIG. 5 depicts a top view of another electronic system configuration incorporating an EHD air mover.

With reference to FIG. 5, an electronic system includes an EHD air mover 220 in place of the mechanical air mover of FIG. 4. Battery 208 extends into a portion of the volume that would otherwise be occupied by the mechanical air mover in the configuration of FIG. 4. Thus, system components may be repositioned, and/or alternative components may be used to accommodate interchangeability or alternate system configurations between mechanical air mover 219 and EHD air mover 220. Any number or combination of inlet and outlet configurations may be used in various device configurations. Surfaces of any number of the electronic components within enclosure 202, and even internal enclosure surfaces can be provided with coatings robust or resistant to ozone to mitigate the effects of ozone produced by EHD air mover 220.

In some implementations, outlet vents or heat transfer surfaces can be configured to provide a lower air flow impedance to flow through an EHD air mover installation than to flow through a mechanical air mover installation. For example, heat transfer fins for use with the EHD air mover may have a wider fin pitch or lesser fin depth relative to heat transfer fins for use with the mechanical air mover. Similarly, air flow motivated by the mechanical air mover may support increased thermal loading of respective heat transfer surfaces relative to those cooled by EHD motivated air flow. For example, using different conductive materials or different heat transfer surface dimensions may be part of a system configuration for use with the respective EHD or mechanical air mover. For example, a thicker copper heat pipe and/or closer fin pitch may be used with the mechanical air mover and a thinner aluminum heat pipe and/or wider fin pitch may be used with the EHD air mover.

In some implementations, heat fins for use with the mechanical air mover are angled with respect to a heat pipe to accommodate an air flow direction or "angle of attack" imparted by rotation of the mechanical air mover. Variations in heat fin angle, dimension, or pitch can also accommodate variation in an air flow profile of the mechanical air mover, e.g., fan blade movement can create a higher pressured faster flow on one side of the air flow and a lower pressure slow flow at the opposite side of the air flow. In some implementations, such variation of heat transfer surfaces can be used to provide a substantially uniform or at least partially smoothed flow profile over respective areas to achieve a more uniform flow through an outlet ventilation boundary.

In some low-profile consumer electronics devices, total device thickness may be less than about 10 mm, with a keyboard assembly occupying a portion of the available vertical thickness. This vertical thickness can accommodate the respective air mover as well as printed circuit board (PCB) mounted integrated circuits, discretes, connectors, etc. occupying a substantial portion of the available interior space. As before, examples of PCB mounted integrated circuits include central processor units (CPUs), graphics processor units (GPUs), communications processors and transceivers, memory, etc., which can often generate a substantial portion of the devices heat load and which, in some embodiments, are cooled by the air movers that can be accommodated closely proximate to the heat sources (or thermally coupled fins/spreaders).

Positioning of system components can accommodate a range of dimensions of either of an EHD air mover or a mechanical air mover. For example, in a particular implementation configured with an EHD air mover, the EHD air mover is approximately 130 mm long, 6 mm tall and 28 mm deep, i.e. flow depth. In contrast, a particular implementation configured with an air mover is approximately 55-65 mm square and over 6 mm thick. In some implementations, two mechanical air movers can be used, e.g., each of approximately 40-50 mm square and over 6 mm thick.

Some implementations of thermal management systems described herein employ EFA or EHD devices to motivate flow of a fluid, typically air, based on acceleration of ions generated as a result of corona discharge. Other implementations may employ other ion generation techniques and will nonetheless be understood in the descriptive context provided herein. Using heat transfer surfaces, heat dissipated by electronics (e.g., microprocessors, graphics units, etc.) and/or other electronic system components can be transferred to the fluid flow and exhausted. Heat transfer paths, e.g., heat pipes, are provided to transfer heat from where it is generated within the internal plenum to a location(s) within the enclosure where air flow motivated by an EHD device(s) flows over heat transfer surfaces to dissipate the heat.

In some implementations, an EHD air cooling system or other similar ion action device may be integrated in an operational system such as a laptop, tablet or desktop computer, a projector or video display device, etc., while other implementations may take the form of subassemblies. Various features may be used with different devices including EFA or EHD devices such as air movers, film separators, film treatment devices, air particulate cleaners, photocopy machines and cooling systems for electronic devices such as computers, laptops and handheld devices. One or more devices includes one of a computing device, set top console, projector, copy machine, fax machine, printer, radio, audio or video recording device, audio or video playback device, communications device, charging device, power inverter, light source, medical device, home appliance, power tool, toy, game console, television, and video display device.

While the foregoing represents a description of various implementations of the invention, it is to be understood that the claims below recite the features of the present invention, and that other implementations, not specifically described hereinabove, fall within the scope of the present invention.

What is claimed is:

1. An electronic system comprising:
    an enclosure housing a plurality of electronic components;
    an air flow path through the enclosure; and
    an EHD air mover positioned to motivate air flow along the air flow path between inlet and outlet ventilation boundaries of the enclosure;
    wherein at least one of the plurality of electronic components is positionally configurable to alternately accommodate a mechanical air mover in place of the EHD air mover within the enclosure.

2. The electronic system of claim 1,
    wherein a connector for a respective one of the electronic components allows for selective configuration in an alternate orientation of the respective one of the electronic components to accommodate a difference in geometry between the EHD air mover and the mechanical air mover.

3. The electronic system of claim 2, further comprising:
first and second mounting points for the respective electronic component in first and second orientations.

4. The electronic system of claim 2, further comprising:
replicated electrical connection points to accommodate the respective electronic component in first and second orientations.

5. The electronic system of claim 1,
wherein the at least one electronic component is repositionable in first and second orientations, the first orientation providing a substantially symmetrical space to accommodate a mechanical fan and the second providing an elongated space to accommodate the EHD air mover.

6. The electronic system of claim 1, further comprising:
a transition duct between the EHD air mover and a portion of the air flow path.

7. The electronic system of claim 6,
wherein the air flow path is configured to accommodate the mechanical air mover via an alternate mechanical air mover transition duct.

8. An electronic system comprising:
an enclosure housing a plurality of electronic components;
an air flow path through the enclosure; and
a mechanical air mover positioned to motivate air flow along the air flow path between inlet and outlet ventilation boundaries of the enclosure;
wherein at least one of the plurality of electronic components is positionally configurable to alternately accommodate an EHD air mover in place of the mechanical air mover within the enclosure.

9. The electronic system of claim 8,
wherein a data connector for the at least one electronic component is one of moveable, pivotable, and flexible to accommodate repositioning of the at least one electronic component.

10. The electronic system of claim 8, further comprising:
replicated electrical connection points to accommodate the respective electronic component in first and second orientations.

11. A method of configuring an electronic system for convective cooling of a plurality of electronic components housed in an enclosure, the method comprising:
positioning at least one of the plurality of electronic components in one of two predetermined configurations to accommodate either of a mechanical air mover and an EHD air mover for convective cooling;
coupling the at least one of the plurality of electronic components to another of the plurality of electronic components in the electronic system in the selective position of the at least one of the plurality of electronic components; and
installing the one of the mechanical fan and the EHD air mover to motivate air flow along an air flow path between inlet and outlet ventilation boundaries of the enclosure.

12. The method of claim 11, further comprising
configuring a connector for coupling the respective one of the electronic components to accommodate a difference in geometry between the EHD air mover and the mechanical air mover.

13. The method of claim 11,
wherein configuring the connector comprises one of pivoting, rotating, and extending the connector based on the selective positioning for the respective electronic component.

14. The method of claim 11,
wherein the respective electronic component is positioned to provide a generally symmetrical volume to accommodate the mechanical air mover.

15. The method of claim 11,
wherein the respective electronic component is positioned to provide a generally elongated volume to accommodate the EHD air mover.

16. The method of claim 11, further comprising
installing a transition duct proximate the positioned one of the mechanical air mover and EHD air mover to define at least a portion of the air flow path.

17. The method of claim 11,
wherein coupling the at least one of the plurality of electronic components comprises selecting a respective one of replicated connection points corresponding to the selected orientation of the respective electronic component.

18. An electronic system comprising:
a substantially sealed enclosure housing a plurality of electronic components;
an air flow path through the enclosure; and
an EHD air mover positioned to motivate air flow along the air flow path;
wherein at least one of the plurality of electronic components is positionally configurable to alternately accommodate a mechanical air mover in place of the EHD air mover within the enclosure.

19. The electronic system of claim 18,
wherein a connector for a respective one of the electronic components allows for selective configuration in an alternate orientation of the respective one of the electronic components to accommodate a difference in geometry between the EHD air mover and the mechanical air mover.

20. The electronic system of claim 18,
wherein the enclosure allows at least some air flow to transit a boundary between an interior enclosure volume and the exterior.

* * * * *